(12) United States Patent
Shin et al.

(10) Patent No.: US 7,888,138 B2
(45) Date of Patent: Feb. 15, 2011

(54) FERROELECTRIC THIN FILM DEVICE AND METHOD OF MANUFACTURING THE SAME

(75) Inventors: Sung-Chul Shin, Daejeon (KR); Sang-Hyun Kim, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 231 days.

(21) Appl. No.: 12/244,094

(22) Filed: Oct. 2, 2008

(65) Prior Publication Data

US 2009/0098664 A1    Apr. 16, 2009

(30) Foreign Application Priority Data

Oct. 11, 2007    (KR) .................. 10-2007-0102747

(51) Int. Cl.
*H01L 21/00* (2006.01)
(52) U.S. Cl. .................. 438/3; 257/E21.208
(58) Field of Classification Search .............. 438/3; 257/E21.208
See application file for complete search history.

(56) References Cited

U.S. PATENT DOCUMENTS

2007/0029592 A1   2/2007   Ramesh
2007/0029593 A1 * 2/2007   Ramesh ............... 257/295

OTHER PUBLICATIONS

Zheng, R. Y. et al.; "Multiferroic BiFeO3 thin films deposited on SrRuO3 buffer layer by rf sputtering"; Mar. 1, 2007; American Institute of Physics; Journal of Applied Physics, vol. 101, Issue 5, pp. 054104-1 through 054104-5.*
R.R. Das et al., "Synthesis and ferroelectric properties of epitaxial BiFeO3 thin films grown by sputtering," Applied Physics Letters 88, 2429041-3 (2006).
J. Wang, et al., "Epitaxial BiFeO3 Multiferroic Thin Film Heterostructures," Swience, vol. 299, (Mar. 14, 2003), pp. 1719-1722.

* cited by examiner

*Primary Examiner*—Matthew C Landau
*Assistant Examiner*—Vicki B Booker
(74) *Attorney, Agent, or Firm*—Fredrikson & Byron, PA

(57) ABSTRACT

The present invention relates to a method of manufacturing a ferroelectric thin film device, and, more particularly, to a method of manufacturing a ferroelectric thin film device having high crystallinity, good surface roughness and high deposition efficiency through on-axis type sputtering, and to a ferroelectric thin film device manufactured using the method. The method of manufacturing a ferroelectric thin film device includes: depositing an $SrRuO_3$ (SRO) thin film on an $SrTiO_3$ (STO) substrate; and depositing a $BiFeO_3$ (BFO) thin film on the deposited SRO thin film, wherein each of the thin films is deposited in a state in which the STO substrate is isolated from the ground. The method of manufacturing a ferroelectric thin film device is advantageous in that a ferroelectric thin film has a uniform surface, thus greatly decreasing the amount of leakage current and increasing remnant polarization.

7 Claims, 8 Drawing Sheets

FERROELECTRIC THIN FILM DEVICE AND METHOD OF MANUFACTURING THE SAME

RELATED APPLICATIONS

This application claims priority to Korean Patent Application No. KR10-2007-0102747 filed Oct. 11, 2007, the teachings of which are incorporated herein by reference.

BACKGROUND OF THE INVENTION

1. Field of the Invention

The present invention relates to a method of manufacturing a ferroelectric thin film device, and, more particularly, to a method of manufacturing a ferroelectric thin film device having high crystallinity, good surface roughness and high deposition efficiency through on-axis type sputtering, and to a ferroelectric thin film device manufactured using the method.

2. Description of the Related Art

A ferroelectric material is a material in which spontaneous polarization, caused by a permanent dipole, exists even when an electric field is not applied, and can be inverted by an external electric field. For this reason, ferroelectric materials are used for various electronic devices, such as piezoelectric devices, optical modulators, storage media, memory devices, and the like.

As ferroelectric materials, $PbTiO_3$, $BaTiO_3$(BTO), $PbZr_xTi_{1-x}O_3$(PZT), $SrBi_2Ta_2O_9$(SBT), and the like are well known. Such ferroelectric materials are well known to be suitable for nonvolatile memory devices. FRAM, which is such a nonvolatile memory device and includes an upper electrode, a ferroelectric thin film deposited on the upper electrode and a lower electrode formed on the ferroelectric thin film, records information by applying an electric field to each of the electrodes. The information recorded in the FRAM in this way does not disappear even when the electric field between the upper and lower electrodes disappears because the FRAM has ferroelectric properties.

Particularly, in ferroelectric materials, remnant polarization characteristics are very important. Recently, $BiFeO_3$ (BFO), having higher remnant polarization than other ferroelectric materials, has been researched [J. Wang, J. B. Neaton, H. Zheng, V. Nagarajan, S. B. Ogale, B. Liu, D. Viehland, V. Vaithyanathan, D. G. Schlom, U. V. Waghmare, N. A. Spldin, K. M. Rabe, M. Wuttig, and R. Ramesh, Science 299, 1719 (200)].

Such a BFO thin film is required to epitaxially grow in order to maximize the remnant polarization characteristics. Conventionally, the epitaxial growth of the BFO thin film has been conducted through a pulsed laser deposition (PLD) method. However, the PLD method is problematic in that it is difficult to use to form a thin film having a large area, and thus the mass production of the BFO thin film is difficult.

Therefore, as a deposition method suitable for producing the BFO thin film in large quantities, a sputtering method may be used. However, the sputtering method is problematic in that the crystallinity and surface roughness of the BFO thin film are not good due to a problem of resputtering. In a ferroelectric thin film, crystallinity and surface roughness act as very important factors. The reason for this is that the poorer crystallinity and surface roughness are, the more leakage current exists, thus deteriorating data maintenance characteristics.

Further, in order to overcome the resputtering problem, the BFO thin film may be formed through off-axis type sputtering, but such off-axis type sputtering is problematic in that the deposition efficiency is very low, thus decreasing industrial applicability.

SUMMARY OF THE INVENTION

Accordingly, the present invention has been made keeping in mind the above problems occurring in the prior art, and an object of the present invention is to provide a method of manufacturing a ferroelectric thin film device, by which a ferroelectric thin film is formed through on-axis type sputtering, so that the deposition efficiency is improved, thereby enabling the mass-production thereof, and by which a ferroelectric thin film is deposited on a substrate in a stated in which the substrate is isolated from a ground, so that the resputtering effect, attributable to oxygen anions, is minimized, thereby minimizing surface roughness, and to provide a ferroelectric thin film device manufactured using the method.

In order to accomplish the above object, the present invention provides a method of manufacturing a ferroelectric thin film device, including: depositing an $SrRuO_3$ (SRO) thin film on an $SrTiO_3$ (STO) substrate; and depositing a $BiFeO_3$ (BFO) thin film on the deposited SRO thin film, wherein each of the thin films is deposited in a state in which the STO substrate is isolated from ground.

In the method, the SRO thin film and the BFO thin film are deposited through on-axis type RF magnetron sputtering.

Further, the BFO thin film is deposited in a state in which the STO substrate is heated to a temperature of 550~650° C.

Further, the BFO thin film is deposited in a state in which the STO substrate is heated to a temperature of 570° C.

Further, the method further includes, after the deposition of the BFO thin film: performing heat treatment at an oxygen pressure of 400 Torr for a predetermined time through an in situ method.

Further, the SRO thin film serves to decrease lattice mismatching between the STO substrate and the BFO thin film, is used as a lower electrode of the ferroelectric thin film device, and has a thickness of 100 nm.

Further, the STO substrate is isolated from the ground through a ceramic insulating layer disposed between a holder provided with the STO substrate and the ground.

Furthermore, the STO substrate is isolated from the ground through a ceramic insulating layer disposed between a holder provided with the STO substrate and the STO substrate.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Hereinafter, preferred embodiments of the present invention will be described in detail with reference to the attached drawings.

Figure 1:
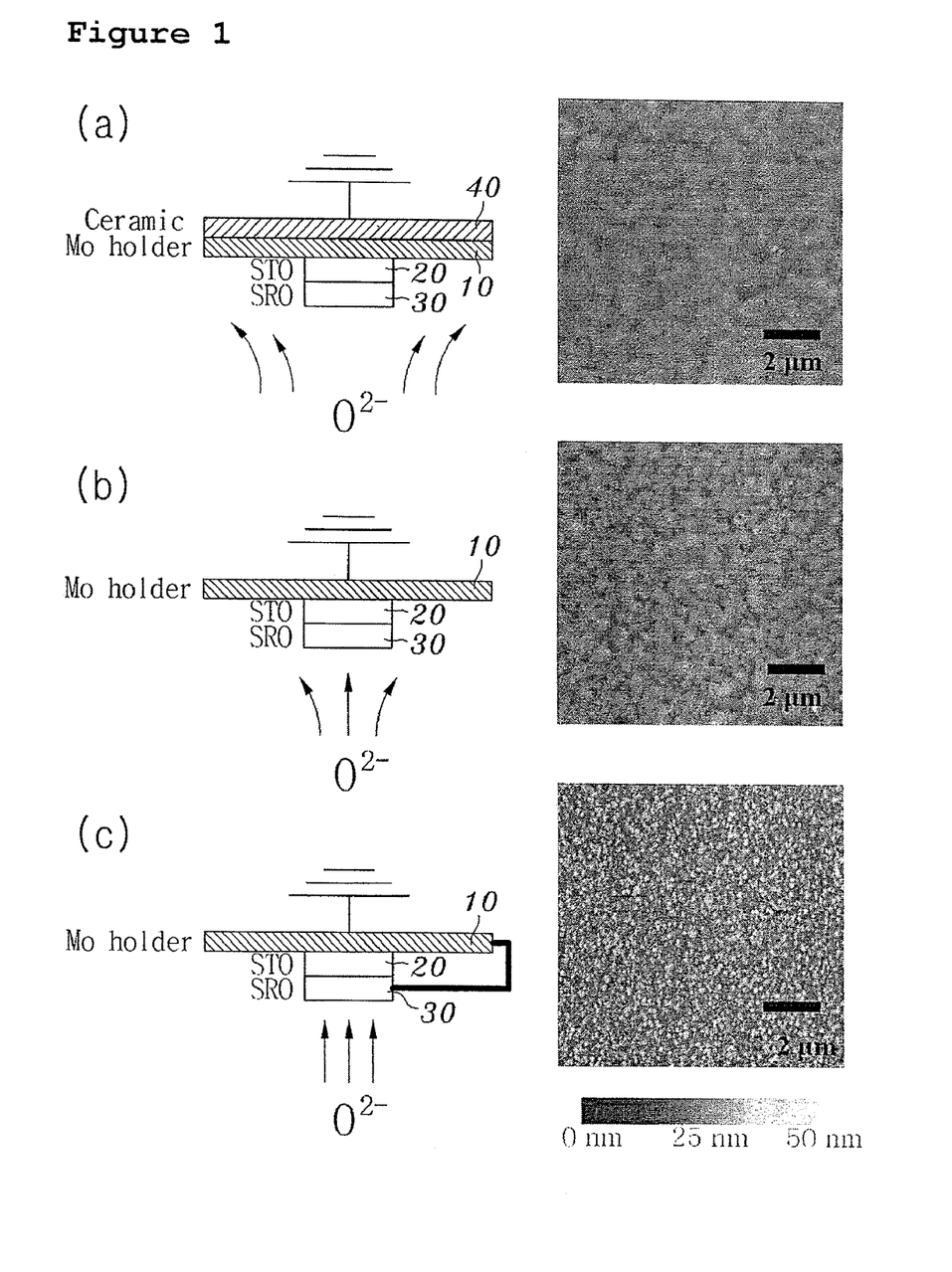
FIGS. 1A, 1B and 1C are views showing apparatuses for manufacturing a ferroelectric thin film device and uniformities of thin films manufactured using the apparatuses, respectively.

FIG. 1A is a view showing an apparatus for manufacturing a ferroelectric thin film device according to an embodiment of the present invention. In order to manufacture a ferroelectric thin film device, first, an $SrTiO_3$ (STO) substrate 20 is attached on a holder 10. In an embodiment of the present invention, as the holder 10, a molybdenum (Mo) holder is used, but the present is not limited thereto. Here, $SrTiO_3$ (STO), which is a dielectric material having a high dielectric constant, is a nonconductive material, that is, an insulating material. Subsequently, an $SrRuO_3$ (SRO) thin film 30, in which SRO is a conductive material, is deposited on the STO substrate 20. In order to deposit the SRO on the STO substrate 20, in a state in which an SRO single target is disposed in a chamber and an inert gas, such as argon (Ar), and oxygen are charged into the chamber, when a potential difference is applied into the chamber using the SRO single target as a cathode, argon plasma ($Ar^+$) is formed, and the argon plasma ($Ar^+$) is applied to the SRO single target, so that SRO molecules rush out of the SRO single target and are then deposited on the STO substrate, thereby forming the SRO thin film 30.

The SRO thin film 30, which is conductive, is formed into a lower electrode when the ferroelectric thin film device is used as a capacitor of a memory device, and is deposited on the STO substrate 20 at a predetermined thickness in order to decrease lattice mismatching between the STO substrate and a $BiFeO_3$ (BFO) thin film which is to be deposited on the SRO thin film 30. It is preferred that the thickness of the SRO thin film 30 be 100 nm.

After the SRO thin film 30 is deposited on the STO substrate 20, a $BiFeO_3$ (BFO) thin film, as an epitaxial layer, is deposited on the SRO thin film 30. The BFO thin film may be deposited through a pulsed laser deposition (PLD) method for the epitaxial growth of the BFO thin film. However, as mentioned above, the PLD method is problematic in that it is not suitable for mass-production. In order to solve the above conventional problem, in the present invention, the ferroelectric thin film device is manufactured through an RF sputtering method. The RF sputtering method is advantageous in that the ferroelectric thin film device can be manufactured in large quantities, but is problematic in that oxygen anions, which are present in a chamber together with an inert gas, cause a resputtering phenomenon, and thus the surface of the manufactured ferroelectric thin film is not uniform. Owing to this problem, the ferroelectric thin film is deposited through an off-axis sputtering method in which a substrate and a target are perpendicular to each other, but the off-axis sputtering method is problematic in that deposition efficiency is not good.

In the present invention, in order to minimize the resputtering phenomenon caused by oxygen anions and to improve deposition efficiency, the deposition is conducted in a state in which the holder 10 provided with the STO substrate is isolated from the ground. For this, in an embodiment of the present invention, the STO substrate is isolated from the ground through an insulating layer disposed between the holder 10 and the ground. Further, the STO substrate may be isolated from the ground through an insulating layer disposed between the STO substrate 20 and the holder 10.

Conventional technologies are problematic in that since the deposition is conducted in a state in which a substrate is connected to the ground, oxygen anions, which are accelerated by a target to which a cathode is applied, collide with the substrate having the same potential as the ground, so that a resputtering phenomenon occurs, with the result that the surface of the thin film is roughened. The Ferroelectric material is characterized in that the rougher its surface, that is, the greater a RMS (root mean square) value, the better the interface between the ferroelectric material and an upper electrode and the lower leakage current.

As shown in FIG. 1A, when a substrate is isolated from the ground, discharged electrons cause the entire holder 10 provided with the substrate to have a negative electric potential. In conventional technologies, in the case in which a substrate is connected to ground, even when electrons flow into the substrate, the electric potential of the substrate does not change. However, in the present invention, since a substrate is isolated from ground, when electrons flow into the substrate, the substrate has a negative electric potential, thus remarkably decreasing the resputtering phenomenon attributable to oxygen anions.

The RMS values of the BFO thin films of FIG. 1A, 1B and 1C are 14 Å, 22 Å, 47 Å, respectively. Therefore, it can be seen that the surface roughness of the BFO thin film improves when a substrate is more securely isolated from a ground. Compared to FIG. 1A, FIG. 1C shows a process of depositing a BFO thin film on a substrate by connecting 50 an SRO thin film 20 to the ground. From FIG. 1C, it can be seen that the surface roughness of the BFO thin film formed through this process is greatly increased compared to FIG. 1A. Thus, as shown in FIG. 3B, it can be seen that the difference in the leakage currents therebetween is very large.

Figure 2A:
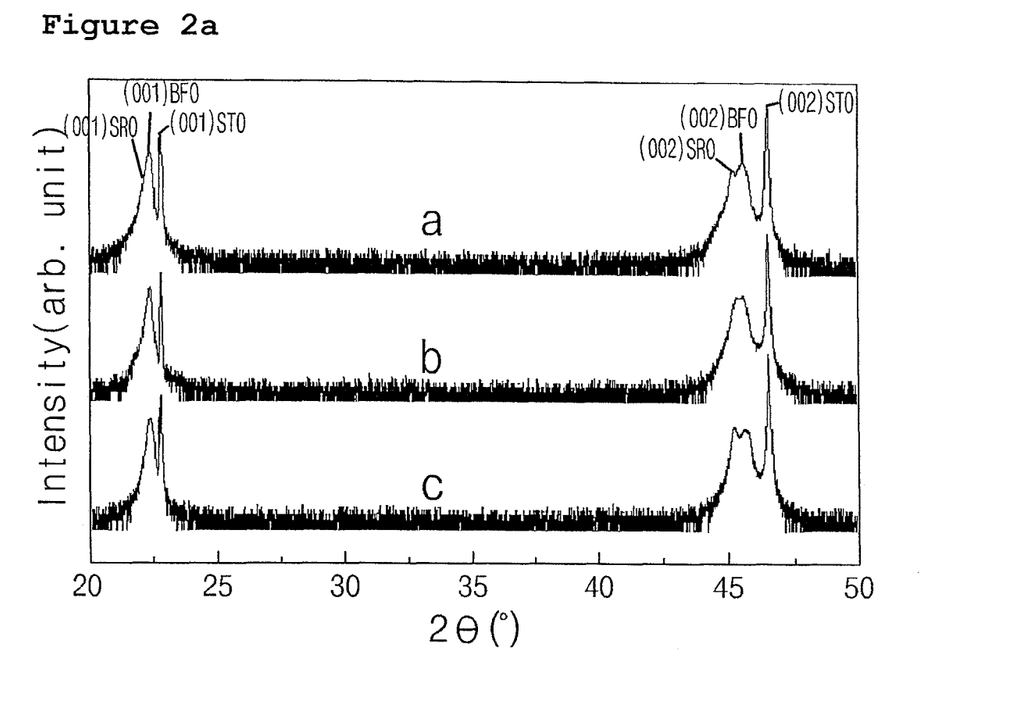
FIGS. 2A, 2B and 2C are XRD graphs of thin films manufactured using the apparatuses for manufacturing a ferroelectric thin film device shown in FIG. 1, respectively.
Figure 2B:
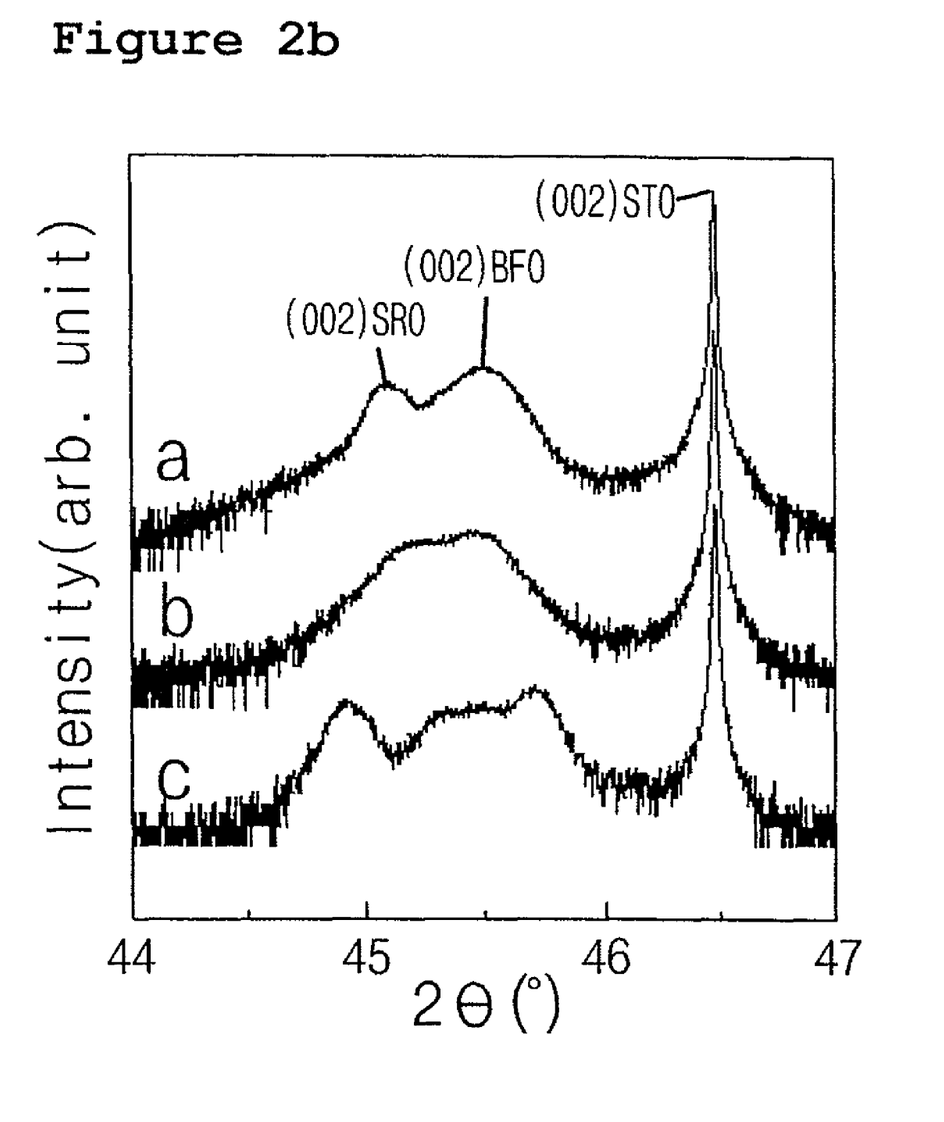
Figure 2C:
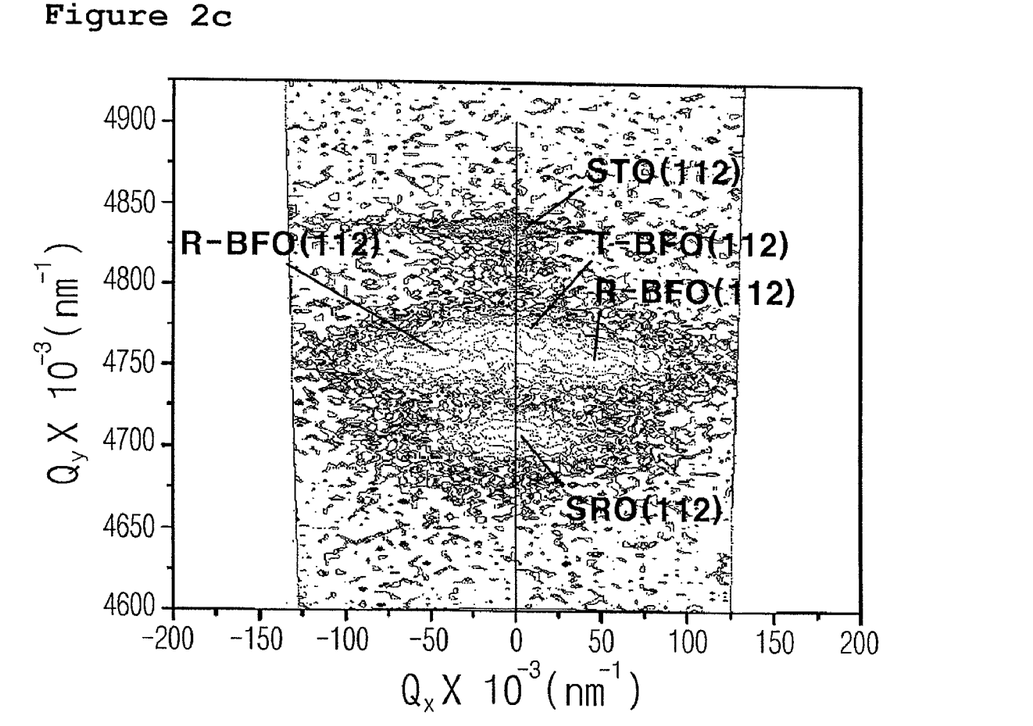

FIG. 2A is a graph showing the results of Θ-2Θ X-Ray Diffraction (XRD) scan of (001)BF0/(001)SRO/(001)STO in the case of FIGS. 1A, 1B and 1C. Referring to this graph, only peaks corresponding to each crystal plane of BFO are clearly observed in the case of FIGS. 1A, 1B and 1C, and thus it can be seen that impurities, related to bismuth (Bi) oxides or iron (Fe) oxides, do not exist. Further, FIG. 2B is a graph showing the results of a Θ-2Θ XRD scan of (002)BFO/(002)SRO/(002)STO at high resolution XRD in the case of FIGS. 1A, 1B and 1C. From FIG. 2B it can be seen that, in the case of FIG. 1C, the peaks of the BFO thin film are widened, but, in the case of FIG. 1A, the peaks of the BFO thin film are clear and can be distinguished from the peaks of the SRO thin film. The reason for this is that the resputtering phenomenon attributable to oxygen anions is decreased, so that the BFO thin film and the STO substrate are much more clearly distinguished from each other, thereby improving the crystallinity of the BFO thin film. That is, as shown in FIG. 2B, it can be seen that the resputtering phenomenon attributable to oxygen anions is decreased, so that the crystallinity of the BFO thin film is improved, with the result that the BFO thin film is uniformly deposited. FIG. 2C is a graph showing the results of XRD RSM (reciprocal space mapping) for verifying the epitaxial growth of the BFO thin film. In FIG. 2C, the X axis and Y axis designate in-plane mismatching and out-of-plane mismatching, respectively. In the Y axis, the centers of diffraction spots of the thin films are mismatched with each other, and this fact means that the out-of-plane lattice constants of the thin films are different from each other. Further, this fact is naturally attributable to the difference in crystalline structures of the STO substrate, BFO thin film and SRO thin film. In particular, it can be shown in FIG. 2C that the BFO thin film has three centers having a fully-strained tetragonal structure in the middle thereof and relaxed bulk-like rhombohedral structures on both sides thereof. Base on this fact, it can be seen that the change in in-plane lattice constant, occurring in the procedure in which the fully-strained tetragonal structure is changed into the relaxed bulk-like rhombohedral structures in the BFO thin film under the influence of the STO substrate, is reflected, and thus the distortion between the fully-strained tetragonal structure and the relaxed bulk-like rhombohedral structure in the BFO thin film is 0.5. From this result, it can be seen that the BFO thin film is epitaxially grown under the influence of the STO substrate, and the BFO thin film and SRO thin film are mismatched with the STO substrate.

Figure 3A:
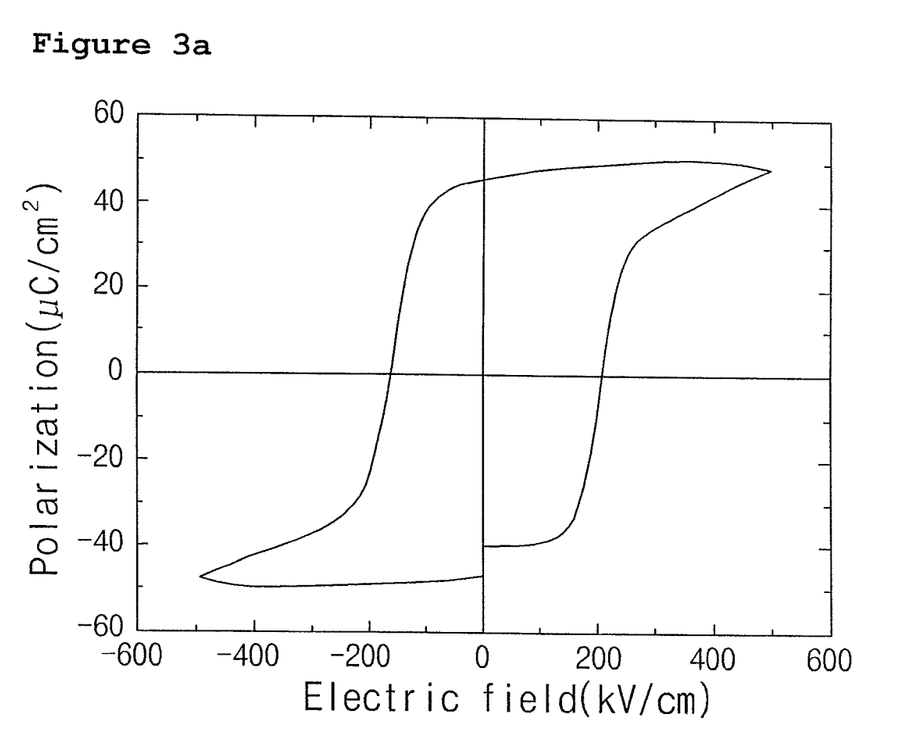
FIGS. 3A, 3B, 3C and 3D are graphs showing the P-E loop and leakage current density of thin films manufactured using the apparatuses for manufacturing a ferroelectric thin film device shown in FIG. 1, respectively.
Figure 3B:
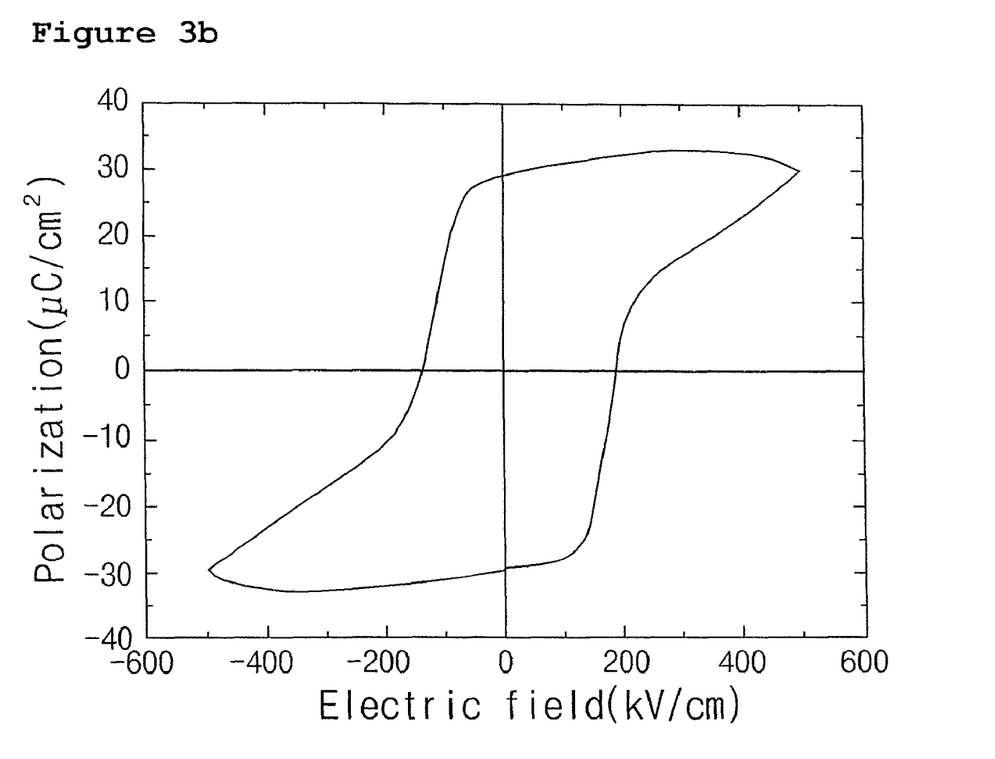
Figure 3C:
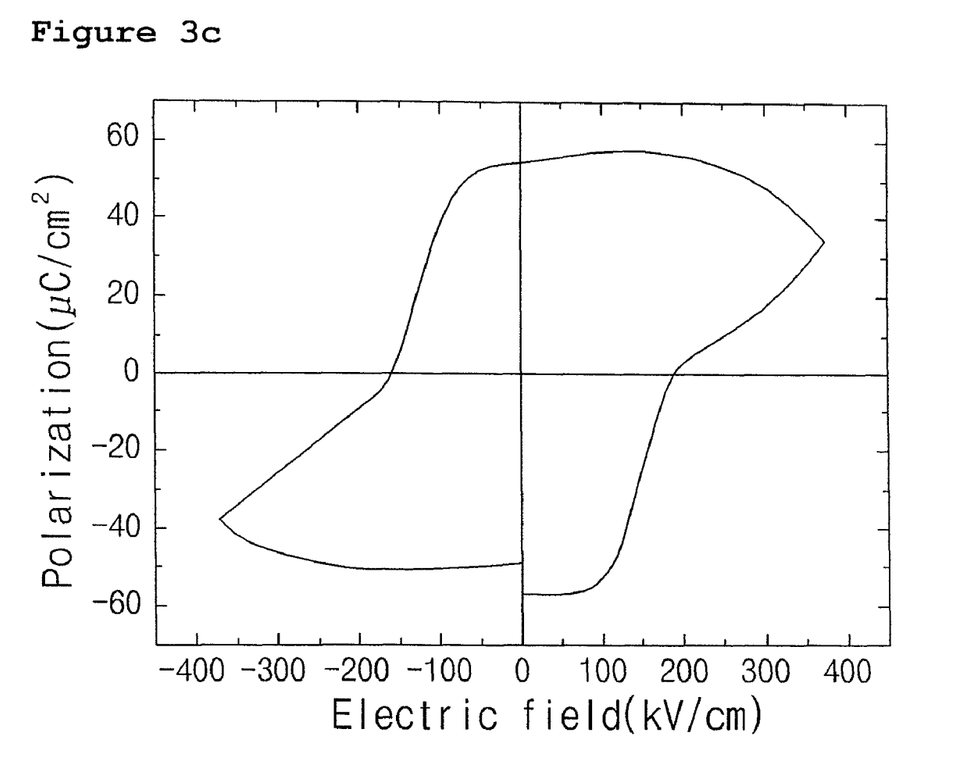

FIGS. 3A, 3B and 3C are graphs showing the P-E loops of ferroelectric thin film devices manufactured through the methods shown in FIGS. 1A, 1B and 1C, respectively, in which the P-E loops of ferroelectric thin film devices are measured at a frequency of 1 kHz. Referring to FIG. 3A, in the case of the ferroelectric thin film device manufactured according to the method shown in FIG. 1A, remnant polarization is 48 $\mu C/cm^2$, and a P-E loop is sharp, and thus the ferroelectric thin film device is well saturated. In contrast, referring to FIGS. 3B and 3C, in the case of the ferroelectric thin film device manufactured according to the method shown in FIG. 1B, remnant polarization is 48 $\mu C/cm^2$, and in the case of the ferroelectric thin film device manufactured according to the method shown in FIG. 1C, the ferroelectric thin film device is not well saturated, so that it is difficult to accurately measure remnant polarization. This result is attributable to a leakage current, and thus, in the case of the ferroelectric thin film device manufactured according to the method shown in FIG. 1A, the leakage current is very small.

Figure 3D:
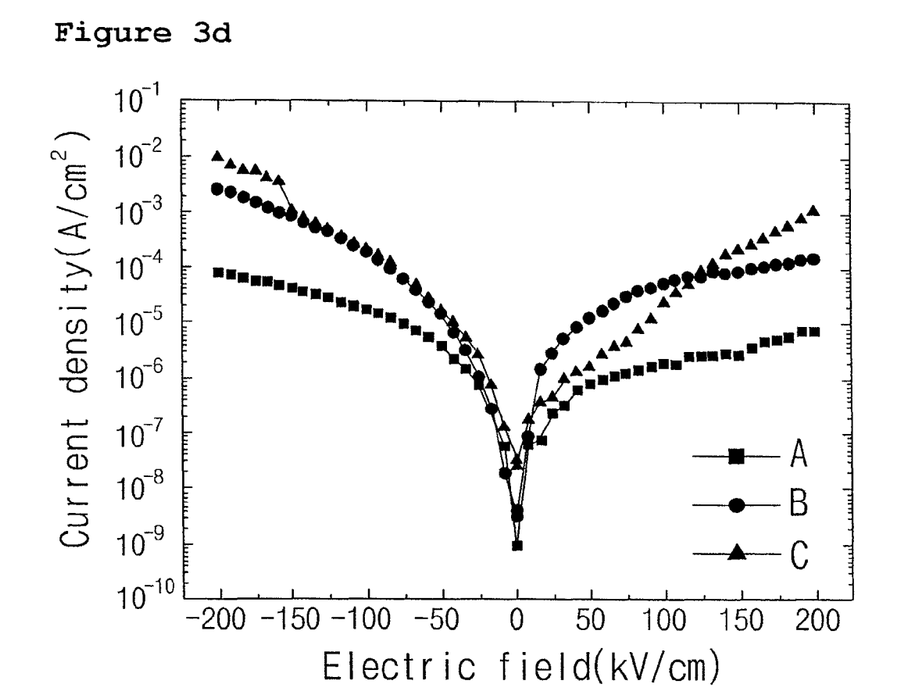

FIG. 3D is a graph showing the leakage current density of ferroelectric thin film devices manufactured through the methods shown in FIGS. 1A, 1B and 1C. From FIG. 3D, it can be seen that the leakage current density of the ferroelectric thin film device manufactured through the method shown in FIG. 1B or 1C is about 100~1000 times that of the ferroelectric thin film device manufactured through the method shown in FIG. 1A in an electric field of 200 kv/cm. Further, since the remnant polarization value of the BFO thin film according to the present invention is much greater than that of the conventional BFO thin film manufactured through sputtering, it can be seen that the ferroelectric thin film device manufactured according to the method of the present invention has excellent properties. Referring to FIG. 3B, the ferroelectric thin film device manufactured through the method shown in FIG. 1A, which is deposited on a substrate in a state in which the substrate is isolated through a ceramic layer, has smaller leakage current than the ferroelectric thin film device manufactured through the method shown in FIG. 1C in the entire applied voltage range.

In the method of manufacturing a ferroelectric thin film device according to the present invention, the BFO thin film is deposited in a state in which the STO substrate is heated to a temperature of 550~650C. When the temperature is above 650° C., there is a problem in that the composition of BFO is influenced by bismuth (Bi), having high volatility, and thus a pure-phased BFO thin film is not easily formed, and interdiffusion and chemical fluctuation phenomena can occur. In contrast, when the temperature is below 550° C., an epitaxial BFO thin film may not be formed due to the properties of the crystal plane, which is sensitive to temperature. Therefore, it is preferred that the BFO thin film be deposited in a state in which the STO substrate is heated to a temperature of 550~650° C., and particularly 570° C.

After the deposition of the BFO thin film, heat treatment is further performed in an oxygen atmosphere in order to prevent oxygen vacancies from occurring in the BFO thin film. When oxygen vacancies occur in the BFO thin film, since a ferroelectric thin film device has low resistance and high leakage current, stable P-E loops cannot be easily obtained, and remnant polarization values are also rapidly decreased. Therefore, in order to maximize the remnant polarization properties of the ferroelectric thin film, heat treatment is further performed at an oxygen pressure of 400 Torr through an in situ method, thus manufacturing an excellent ferroelectric thin film device. After the heat treatment is performed, an upper electrode is deposited on the BFO thin film. As the upper electrode, various materials may be used, and in particular, electroconductive materials containing platinum (Pt) and oxygen may be used.

As described above, the present invention is advantageous in that a ferroelectric thin film device is manufactured through RF magnetron sputtering, thus enabling mass-production.

Further, the present invention is advantageous in that a ferroelectric thin film is deposited through on-axis type sputtering, thus greatly improving deposition efficiency.

Further, the present invention is advantageous in that a ferroelectric thin film is deposited in a state in which a holder provided with a substrate is isolated from ground, thus enabling the ferroelectric thin film to have a uniform surface.

Furthermore, the present invention is advantageous in that a ferroelectric thin film has a uniform surface, thus greatly decreasing the amount of leakage current and increasing remnant polarization.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method of manufacturing a ferroelectric thin film device, comprising:
    depositing an $SrRuO_3$ (SRO) thin film on an $SrTiO_3$ (STO) substrate; and
    depositing a $BiFeO_3$ (BFO) thin film on the deposited SRO thin film,
    wherein each of the thin films is deposited in a state in which the STO substrate is isolated from a ground wherein the BFO thin film is deposited in a state in which the STO substrate is heated to a temperature of 570° C.

2. A method of manufacturing a ferroelectric thin film device, comprising:
    depositing an SrRuO3 (SRO) thin film on an SrTiO3 (STO) substrate;
    depositing a BiFeO3 (BFO) thin film on the deposited SRO thin film; and
    performing a heat treatment at an oxygen pressure of 400 Torr for a predetermined time through an in situ method,
    wherein each of the thin films is deposited in a state in which the STO substrate is isolated from a ground.

3. A method of manufacturing a ferroelectric thin film device, comprising:
    depositing an SrRuO3 (SRO) thin film on an SrTiO3 (STO) substrate; and
    depositing a BiFeO3 (BFO) thin film on the deposited SRO thin film,
    wherein each of the thin films is deposited in a stage in which the STO substrate is isolated from a ground, and wherein the STO substrate is isolated from the ground by a ceramic insulating layer disposed between a holder provided with the STO substrate and the ground.

4. The method of manufacturing a ferroelectric thin film device according to any one of claims 1, 2 and 3, wherein the SRO thin film and the BFO thin film are deposited through on-axis type RF magnetron sputtering.

5. The method of manufacturing a ferroelectric thin film device according to any one of claims 2 and 3, wherein the BFO thin film is deposited in a state in which the STO substrate is heated to a temperature of 550~650° C.

6. The method of manufacturing a ferroelectric thin film device according to any one of claims 1, 2 and 3, wherein the SRO thin film serves to decrease lattice mismatching between the STO substrate and the BFO thin film, is used as a lower electrode of the ferroelectric thin film device, and has a thickness of 100 nm.

7. The method of manufacturing a ferroelectric thin film device according to any one of claims 1 and 2, wherein the STO substrate is isolated from the ground by a ceramic insulating layer disposed between a holder provided with the STO substrate and the STO substrate.

* * * * *